(12) United States Patent
Hsieh et al.

(10) Patent No.: US 6,617,233 B2
(45) Date of Patent: Sep. 9, 2003

(54) PROCESS OF FABRICATING AN ANTI-FUSE FOR AVOIDING A KEY HOLE EXPOSED

(75) Inventors: Tsong-Minn Hsieh, Miaoli (TW); Ruey Jiunn Guo, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/998,263

(22) Filed: Nov. 30, 2001

(65) Prior Publication Data

US 2003/0092247 A1 May 15, 2003

(30) Foreign Application Priority Data

Nov. 12, 2001 (TW) .......................................... 090127983

(51) Int. Cl.[7] .............................................. H01L 21/44
(52) U.S. Cl. ........................ 438/600; 438/633; 438/131; 438/701; 438/978
(58) Field of Search ................................. 438/131, 600, 438/622, 627, 640, 673, 713, 774, 629, 631, 637, 672, 675, 692, 700, 701, FOR 118, 633, 978, FOR 458, FOR 492

(56) References Cited

U.S. PATENT DOCUMENTS 5,364,817 A * 11/1994 Lur et al. .................... 438/644
5,763,898 A * 6/1998 Forouhi et al. ............... 257/50
6,174,796 B1 * 1/2001 Takagi et al. ................ 438/622

* cited by examiner

Primary Examiner—George Fourson
Assistant Examiner—Julio J. Maldonado
(74) Attorney, Agent, or Firm—Charles C. H. Wu; Wu & Cheung, LLP

(57) ABSTRACT

A process of forming an anti-fuse. First, an inter-metal dielectric layer, in which a funnel-shaped via is formed, is formed on a substrate. Next, a first conductive layer is formed over the substrate and filled into the funnel-shaped via. Subsequently, by, for example, a chemical mechanical polishing process, the first conductive layer outside the funnel-shaped via is removed to form a conductive plug. Afterward, an oxide chemical mechanical polishing process is performed to smooth the surface of the conductive plug. Next, a dielectric layer is formed on the top side of the conductive plug, and then a top plate is formed on the dielectric layer. Subsequently, an insulating layer is formed over the substrate, wherein the insulating layer is provided with a via and the via exposes the top plate. Finally, a second conductive layer is formed over the substrate and filled into the via.

20 Claims, 6 Drawing Sheets

PROCESS OF FABRICATING AN ANTI-FUSE FOR AVOIDING A KEY HOLE EXPOSED

CROSS-REFERENCE TO RELATED APPLICATION

This application claims the priority benefit of Taiwan application serial no. 90127983, filed Nov. 12, 2001.

BACKGROUND OF THE INVENTION

1. Field of the Invention

The invention relates in general to a structure of a semiconductor device and a process of fabricating the same. More particularly, the invention relates to a process of fabricating an anti-fuse.

2. Description of the Related Art

Anti-fuses, in a gate array of a logical circuit, are used to connect all transistors, respectively. In other words, each of the transistors, in the gate array, is provided with one of the anti-fuses to connect respectively with the other transistors, and the function of the anti-fuses is to make the gate array programmable. A conventional anti-fuse is a structure of metal layer-dielectric layer-metal layer. The current structure of an anti-fuse further includes a passivation layer between the dielectric layer and the metal layer such that the dielectric layer can be protected and not destroyed by a following etching process. When a gate array is being programmed using an anti-fuse, a high voltage is applied to the anti-fuse in such a way that the dielectric layer of the anti-fuse is broken-down and, thus, the anti-fuse is in an open state. On the contrary, if no voltage is applied to the anti-fuse, the anti-fuse is in a closed state. Therefore, the process of programming with anti-fuses is by applying a voltage or no voltage to the anti-fuses and so making them in an open or closed state, in order to achieve the objective of programming a gate array.

Schematic cross-sectional views of a fabricating process of a conventional anti-fuse are shown from FIG. 1A to FIG. 1E.

As shown in FIG. 1A, in the conventional anti-fuse, an inner metal dielectric layer 104 is formed on a substrate 100 provided with a conductive layer 102, and a via 106 is formed. Subsequently, a tungsten layer 108 is formed over the substrate 100 and filled into the via 106. However, with the development of device size becoming smaller and smaller, when the tungsten layer 108 is being formed in the via 106, a suspending protrusion forms at a top edge of the via 106, such that a key hole 110 is formed. However, the key hole 110 is not easily removed.

Subsequently, as shown in FIG. 1B, a tungsten chemical mechanical polishing process (WCMP) is performed in such a way that the tungsten layer 108 outside the via 106 is removed, and then a metal plug 108a is formed. However, the tungsten chemical mechanical polishing process, used to perform planarization, causes the surface 112 of the metal plug 108a to become rough. Therefore, a physical polishing process is next performed to make the surface 112 smooth.

Next, as shown in FIG. 1C, an oxide chemical mechanical polishing process (Oxide CMP) is performed to smooth the surface 112 of the metal plug 108a. However, in the process, the key hole 110 of the metal plug 108b appears on the surface 112a.

Subsequently, as shown in FIG. 1D, after a dielectric layer 114 is covered on a top side of the metal plug 108b, a titanium nitride passivation layer is formed on the dielectric layer 114, which thus protects the dielectric layer 114 so it is not destroyed by a conductive layer formed in a following process. However, because the key hole 110 appears on the metal plug 108b, a tip 118 is formed on a top side of the dielectric layer 114.

Finally, as shown in FIG. 1E, an oxide layer 120, provided with a via 122, is formed over the substrate 100, and the via 122 is positioned on the titanium nitride passivation layer 116. Lastly, a conductive layer 124 is formed over the substrate 100 and filled into the via 122.

Accordingly, because the small-size via of the conventional anti-fuse has a steep profile, the key hole can not be prevented when the metal plug is formed in the via. Therefore, the key hole, after a planarization process is performed, usually appears on the metal plug, and thus the tip is formed on the top side of the dielectric layer of the anti-fuse. The tip is a leakage-current source of the anti-fuse.

In order to avoid the above problem, a key size of a big and tapered shape is applied to improve the key-hole problem. However, as the size of the anti-fuse increases, this leads to an impact on the ability to shrink the device in the future.

SUMMARY OF THE INVENTION

Therefore, it is an objective according to the present invention to provide a process of fabricating an anti-fuse while preventing a key hole appearing on a metal plug in the anti-fuse.

It is another objective according to the present invention to provide a process of fabricating an anti-fuse while avoiding a tip formed on a top side of a dielectric of the anti-fuse.

It is another objective according to the present invention to provide a process of fabricating an anti-fuse while reducing a leakage current thereof.

It is another objective according to the present invention to provide a process of fabricating an anti-fuse while avoiding the key size of the big and tapered shape according to the prior art, and so avoiding increasing anti-fuse size.

To achieve the foregoing and other objects, the present invention provides a process of forming an anti-fuse. First, an inter-metal dielectric layer is formed on a substrate and a funnel-shaped via is formed in the inter-metal dielectric layer. Next, a first conductive layer is formed over the substrate and the first conductive layer is filled into the funnel-shaped via. Subsequently, by, for example, a chemical mechanical polishing process, the first conductive layer outside the funnel-shaped via is removed to form a conductive plug. Afterward, an oxide chemical mechanical polishing process is performed to smooth the surface of the conductive plug. Next, a dielectric layer is formed on the top side of the conductive plug, and then a top plate is formed on the dielectric layer such that the dielectric layer can be protected and not be destroyed by a second conductive layer formed in a following process. Subsequently, an insulating layer is formed over the substrate, wherein the insulating layer provides a via and the via exposes the top plate. Finally, a second conductive layer is formed over the substrate and the second conductive layer is filled into the via.

According to the present invention, the funnel-shaped via acts as the hole, into which the conductive layer is filled. Because, the funnel-shaped via has a relatively wide dimension at an open end thereof and a relatively narrow dimension at a bottom end thereof, a key hole is only formed in the bottom side of the relatively narrow portion of the funnel-shaped via, such that the key hole does not appear on the conductive plug of the anti-fuse. Therefore, the leakage current of the anti-fuse drops, and the size of a big and tapered shape is not applied to the anti-fuse, which thus cures the defect of increasing the size of the anti-fuse.

Both the foregoing general description and the following detailed description are exemplary and explanatory only and are not restrictive of the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. A simple description of the drawings is as follows.

From FIG. 1A to FIG. 1E show schematic cross-sectional views of a fabricating process of a conventional anti-fuse.

Figure 1A:
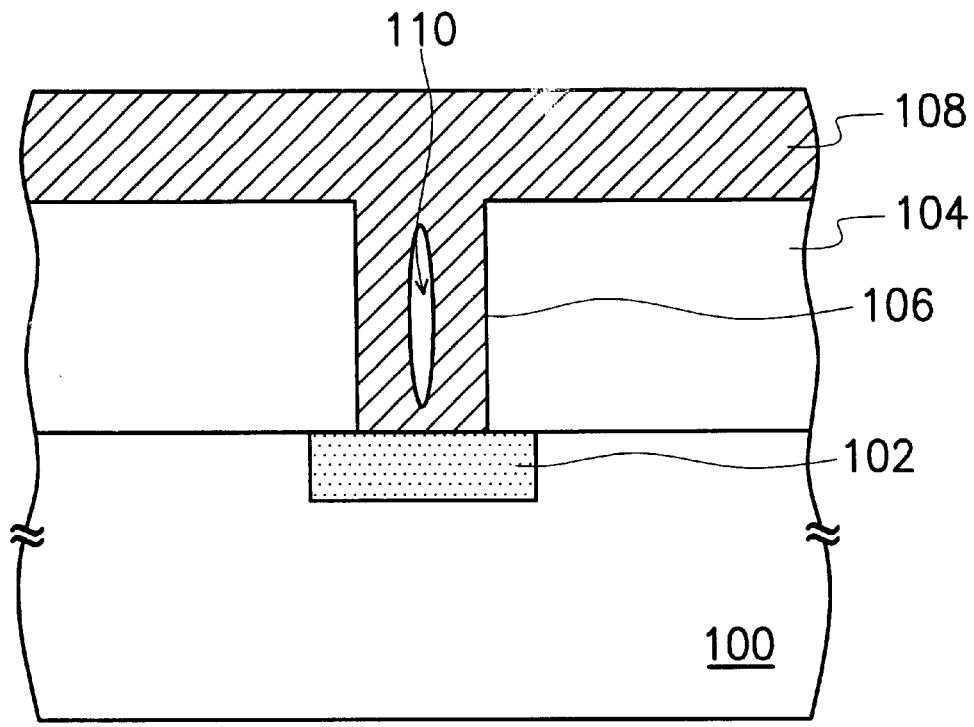
Figure 1B:
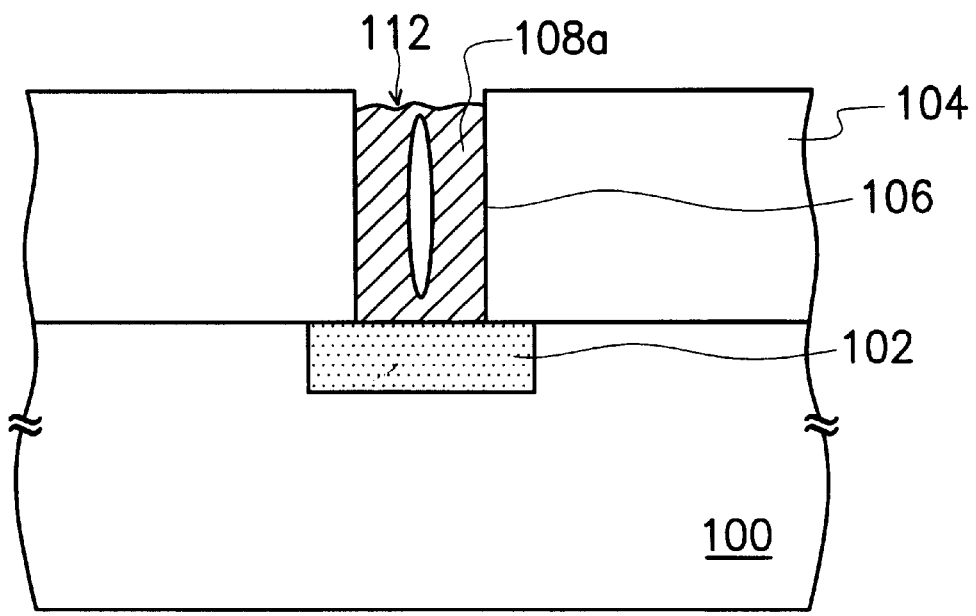
Figure 1C:
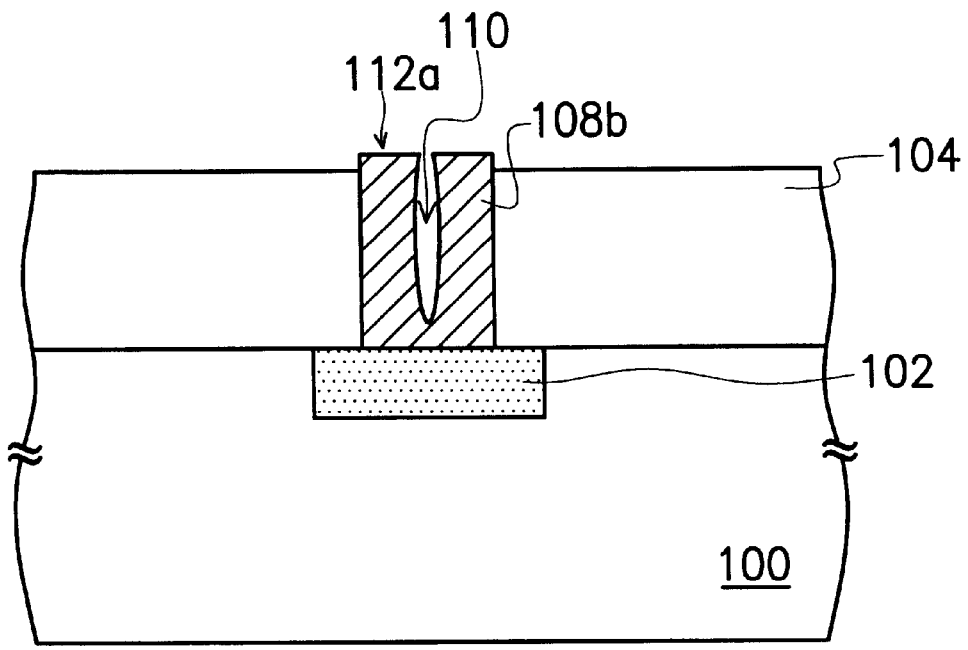
Figure 1D:
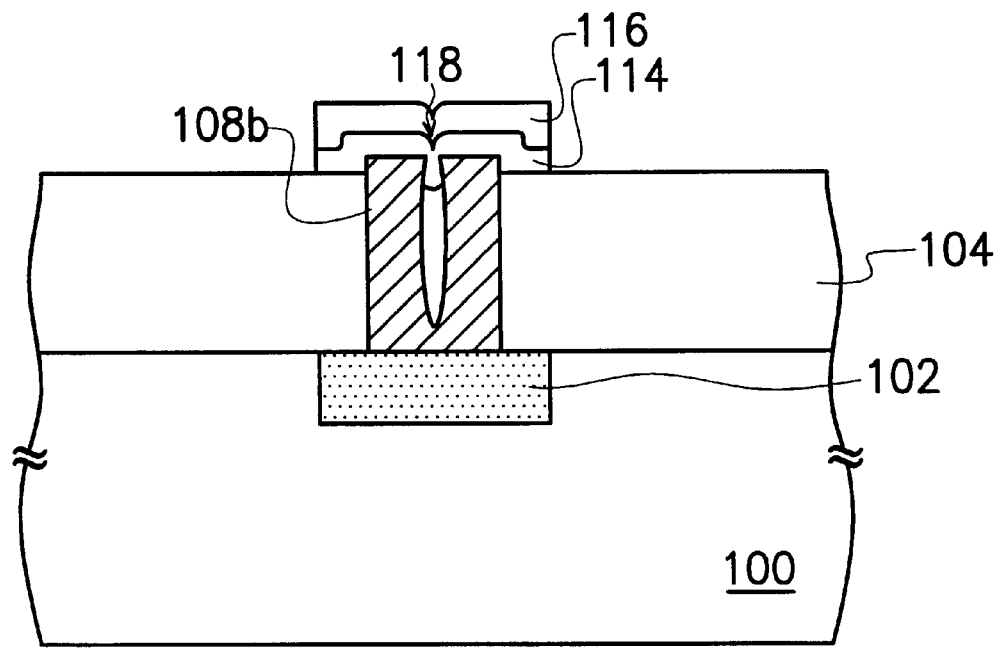
Figure 1E:
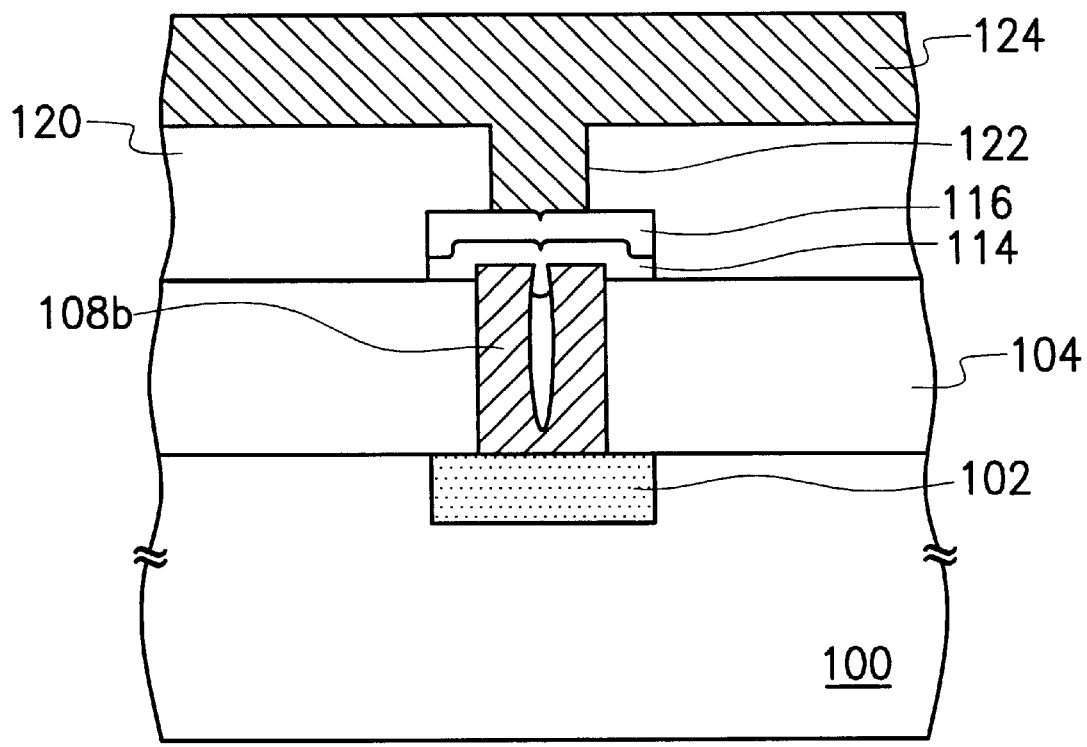

From FIG. 2A to FIG. 2E show schematic cross-sectional views of a fabricating process of an anti-fuse according to the present invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Schematic cross-sectional views of a fabricating process of an anti-fuse according to the present invention are shown from FIG. 2A to FIG. 2E.

Figure 2A:
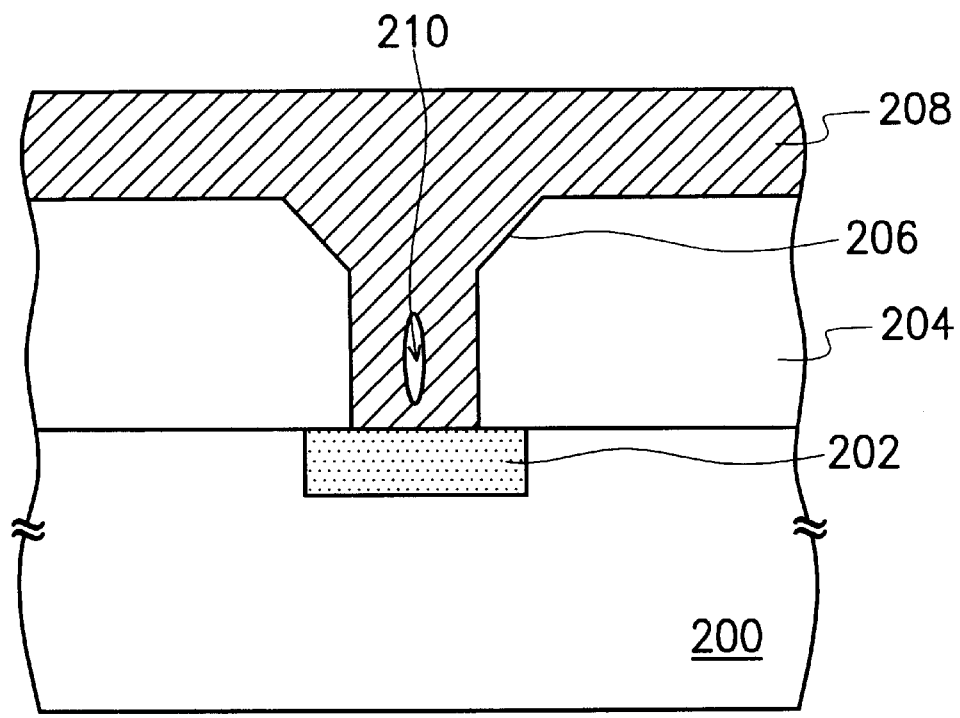

As shown in FIG. 2A, a substrate 200 is provided and a conductive layer 202 is formed on the substrate 200. Next, an inter-metal dielectric layer 204 (IMD Layer) is formed on the substrate 200, a funnel-shaped via 206 is formed in the inter-metal dielectric layer 204. The funnel-shaped via 206 has a relatively wide dimension at an open end thereof and a relatively narrow dimension at a bottom end thereof, wherein the stature of the relatively narrow portion is approximately the same as that of a conductive plug of a completed anti-fuse. Subsequently, a first conductive layer 208, material of which is, for instance, tungsten, is formed over the substrate 200, and filled into the funnel-shaped via 206. Because of the special configuration of the funnel-shaped via 206, a key hole 210 is only formed in the bottom side of the relatively narrow portion of the funnel-shaped via 206.

Figure 2B:
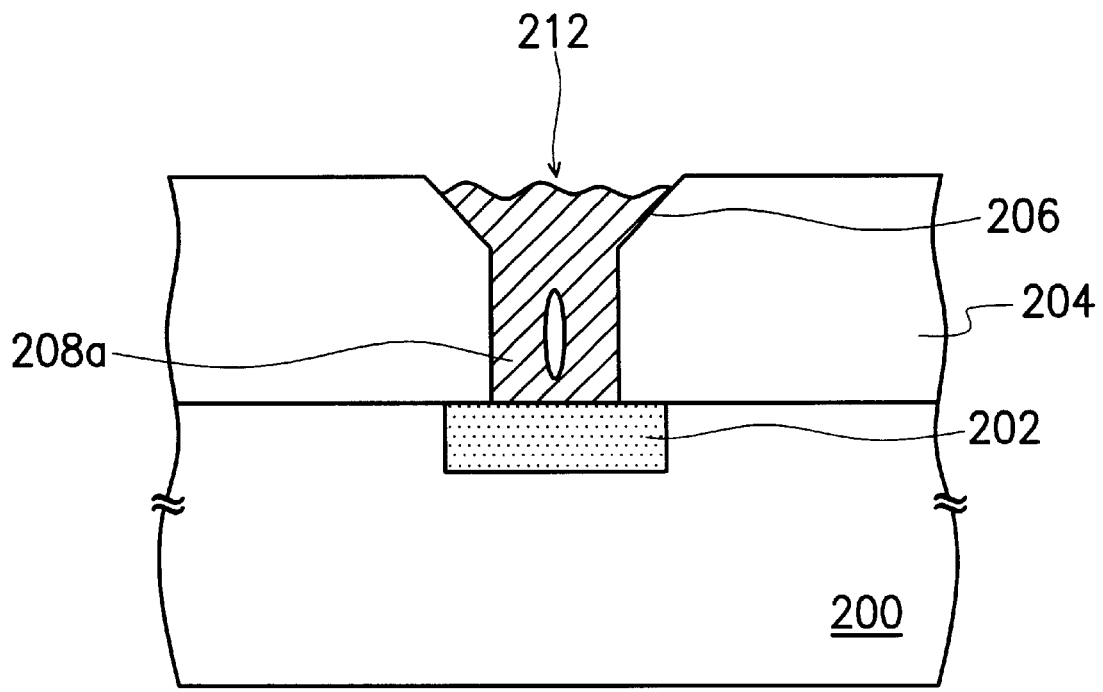

Subsequently, as shown in FIG. 2B, the first conductive layer 208 outside the funnel-shaped via 206 is removed to form a conductive plug 208a, for an example of a preferred way, by a chemical mechanical polishing process. However, according to the present invention, a chemical polishing method, such as a tungsten chemical mechanical polishing process, is applied so that the conductive plug 208a is partly removed along a grain edge of a surface 212 thereof, which thus causes the surface 212 of the conductive plug 208a to become rough. Therefore, a physical polishing process is next performed to make the surface 212 smooth.

Figure 2C:
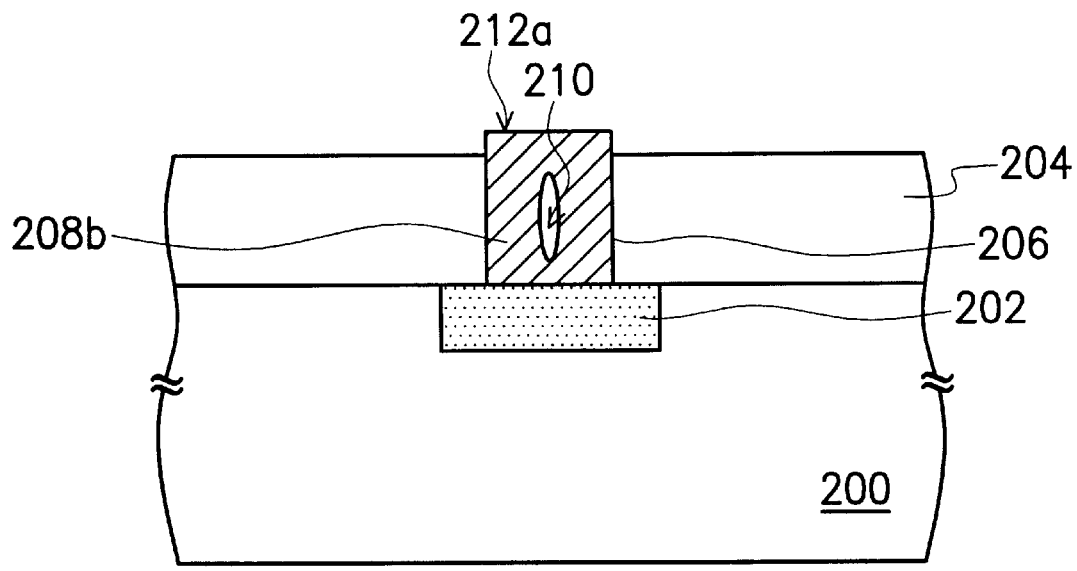

Afterward, as shown in FIG. 2C, an oxide chemical mechanical polishing process (Oxide CMP) is performed, and, meanwhile, oxides removed from the inter-metal dielectric layer 204 act as physical polishing grains of the conductive plug 208a, such that the surface 212 of the conductive plug 208a becomes smooth and the top side of the conductive plug 208b is made to protrude from the inter-metal dielectric layer 204. In addition, as long as the oxide chemical mechanical polishing process is appropriately controlled to remove the inter-metal dielectric layer 204 formed in the relatively wide portion of the funnel-shaped via 206, the size of the resultant conductive plug 208b doesn't increase, and there isn't the conventional problem of increasing anti-fuse size. Besides, because the key hole 210 is only formed in the bottom side of the relatively narrow portion of the funnel-shaped via 206, the key hole 210 of the conductive plug 208b, even after the above planarization process is performed, does not appear on the surface 212a.

Figure 2D:
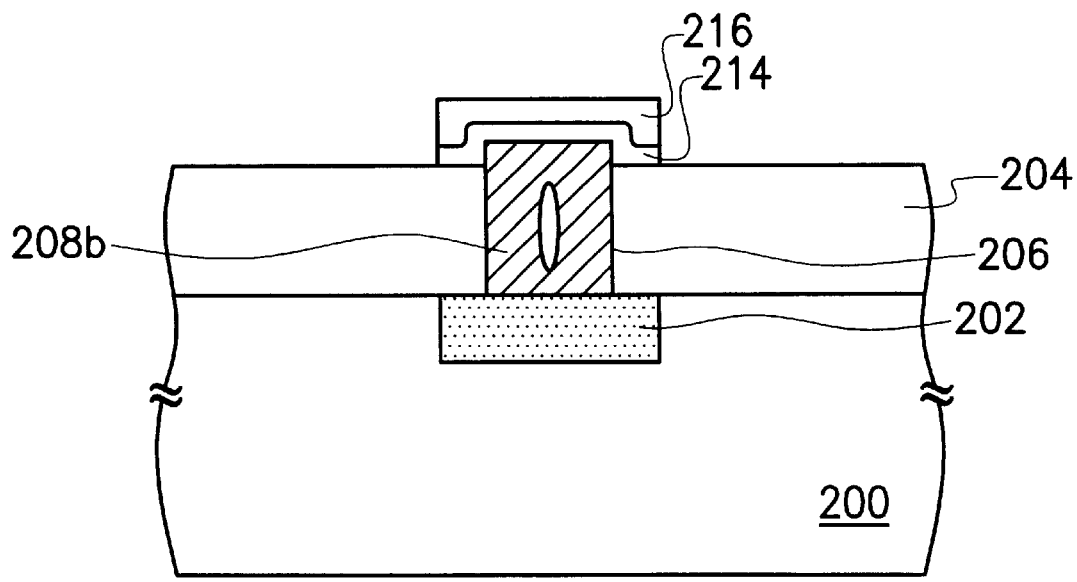

Next, as shown in FIG. 2D, a dielectric layer 214, material of which is, for example, oxide, oxide/nitride/oxide (ONO), amorphous silicon (a-Si), or nitride/amorphous silicon (N/a-Si), is covered on the top of the conductive plug 208b. Subsequently, a top plate 216, material of which is, for example, is titanium nitride, is formed on the dielectric layer 214 such that the dielectric layer 214 can be protected and not be destroyed by a second conductive layer formed in a following process. According to the present invention, because the key hole 210 does not appear on the conductive plug 208b, there is no tip formed on the top of the dielectric layer 214, unlike prior art.

Figure 2E:
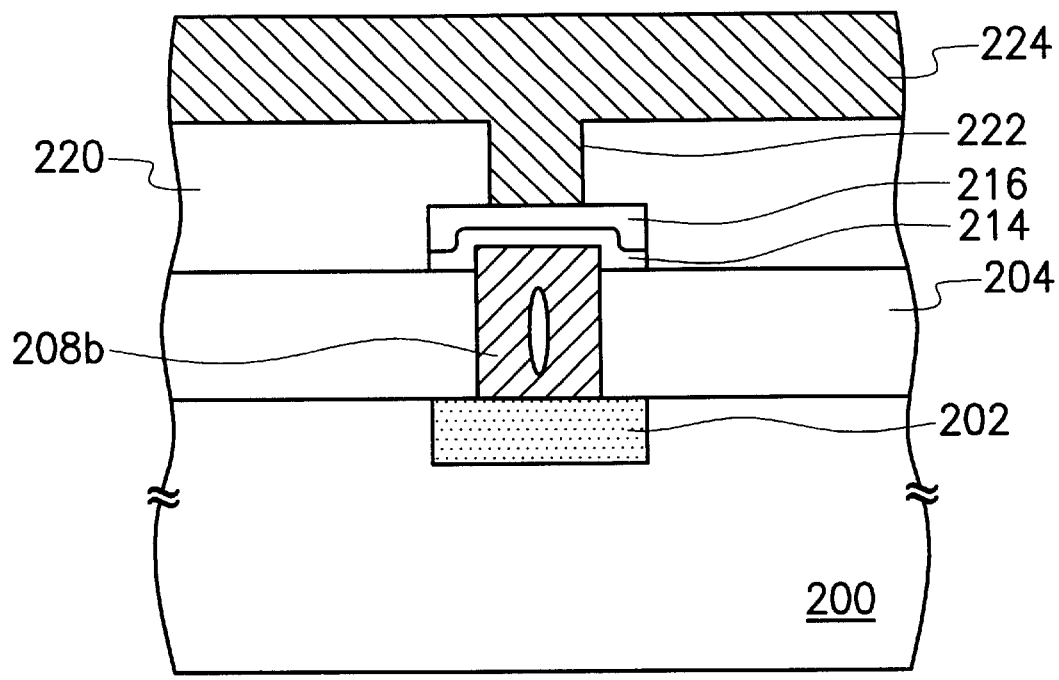

Finally, as shown in FIG. 2E, an insulating layer provided with a via 222 is formed over the substrate 200 and the via 222 exposes the top plate 216. Lastly, a second conductive layer 224, material of which is, for example, aluminum, is formed over the substrate 200 and filled into the via 222.

To sum up, features of the present invention include:

1. According to the present invention, a funnel-shaped via acts as the hole into which the conductive layer is filled. Because, the funnel-shaped via has a relatively wide dimension at an open end thereof and a relatively narrow dimension at a bottom end thereof, the key hole of the anti-fuse does not appear after the conductive layer outside the funnel-shaped via is removed, and the surface of the conductive layer is smoothed by the oxide chemical mechanical polishing process to form the conductive plug.

2. According to the present invention, the key hole is only formed in the bottom side of the relatively narrow portion of the funnel-shaped via, such that the key hole does not appear on the conductive plug of the anti-fuse. Accordingly, a tip is not formed on the dielectric layer, and leakage current of the anti-fuse drops.

3. According to the present invention, the funnel-shaped via acts as the hole into which the conductive layer is filled. Consequently, the key hole does not appear, and as the size of a big and tapered shape is not applied to the anti-fuse, the conventional defect of increasing anti-fuse size can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process of fabricating an anti-fuse, comprising:
   providing a substrate;

forming an inter-metal dielectric layer on the substrate;

forming a funnel-shaped via in the inter-metal dielectric layer;

forming a first conductive layer over the inter-metal dielectric layer and filling the first conductive layer into the funnel-shaped via, wherein a key hole is formed in the bottom side of the funnel-shaped via;

removing the first conductive layer outside the funnel-shaped via to form a conductive plug, wherein the key hole in the conductive plug is not exposed;

performing an oxide chemical mechanical polishing process to smooth the conductive plug and to make the top side of the conductive plug protrude from the inter-metal dielectric layer;

covering a dielectric layer on the top side of the conductive plug;

forming a top plate on the dielectric layer;

forming an insulating layer over the substrate, wherein the insulating layer is provided with a via and the via exposes the top plate; and forming a second conductive layer over the insulating layer and filling the second conductive layer into the via.

2. The process of fabricating an anti-fuse according to claim 1, wherein the step of removing the first conductive layer outside the funnel-shaped via, includes a chemical mechanical polishing process.

3. The process of fabricating an anti-fuse according to claim 1, wherein the dielectric layer is made of oxide.

4. The process of fabricating an anti-fuse according to claim 1, wherein the dielectric layer is made of oxide/nitride/oxide.

5. The process of fabricating an anti-fuse according to claim 1, wherein the dielectric layer is made of amorphous silicon.

6. The process of fabricating an anti-fuse according to claim 1, wherein the dielectric layer is made of nitride/amorphous silicon.

7. The process of fabricating an anti-fuse according to claim 1, wherein the top plate is made of titanium nitride.

8. The process of fabricating an anti-fuse according to claim 1, wherein the second conductive layer is made of aluminum.

9. The process of fabricating an anti-fuse according to claim 1, wherein the first conductive layer is made of tungsten.

10. The process of fabricating an anti-fuse according to claim 9, wherein the step of removing the first conductive layer outside the funnel-shaped via, includes a tungsten chemical mechanical polishing process.

11. A process of fabricating an anti-fuse, comprising:

providing a substrate;

forming an inter-metal dielectric layer on the substrate;

forming a first via, wherein the first via has a wide dimension at an open end thereof and a narrow dimension at a bottom end thereof and the narrow portion of the first via has a first height;

forming a first conductive layer over the inter-metal dielectric layer and filling the first conductive layer into the first via, wherein a key hole is formed in the narrow portion of the first via;

removing the first conductive layer outside the first via to form a conductive plug, wherein the key hole in the conductive plug is not exposed;

performing an oxide chemical mechanical polishing process to smooth the conductive plug and removing the inter-metal dielectric layer formed in the wide portion of the first via, wherein the height of the conductive plug is approximately the same as the first height;

covering a dielectric layer on the top side of the conductive plug;

forming a top plate on the dielectric layer;

forming an insulating layer over the substrate, wherein the insulating layer is provided with a second via and the second via exposes the top plate; and forming a second conductive layer over the insulating layer and filling the second conductive layer into the second via.

12. The process of fabricating an anti-fuse according to claim 11, wherein the step of removing the first conductive layer outside the first via, includes a chemical mechanical polishing process.

13. The process of fabricating an anti-fuse according to claim 11, wherein the dielectric layer is made of oxide.

14. The process of fabricating an anti-fuse according to claim 11, wherein the dielectric layer is made of oxide/nitride/oxide.

15. The process of fabricating an anti-fuse according to claim 11, wherein the dielectric layer is made of amorphous silicon.

16. The process of fabricating an anti-fuse according to claim 11, wherein the dielectric layer is made of nitride/amorphous silicon.

17. The process of fabricating an anti-fuse according to claim 11, wherein the top plate is made of titanium nitride.

18. The process of fabricating an anti-fuse according to claim 11, wherein the second conductive layer is made of aluminum.

19. The process of fabricating an anti-fuse according to claim 11, wherein the first conductive layer is made of tungsten.

20. The process of fabricating an anti-fuse according to claim 19, wherein the step of removing the first conductive layer outside the first via, includes a tungsten chemical mechanical polishing process.

* * * * *